United States Patent
Gordon et al.

(10) Patent No.: US 11,735,802 B2
(45) Date of Patent: Aug. 22, 2023

(54) ELECTROPLATED METAL LAYER ON A NIOBIUM-TITANIUM SUBSTRATE

(71) Applicant: International Business Machines Corporation, Armonk, NY (US)

(72) Inventors: Ryan T. Gordon, Yorktown Heights, NY (US); Shawn Anthony Hall, Pleasantville, NY (US); Yu Luo, Hopewell Junction, NY (US); Robert L. Sandstrom, Chestnut Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 6 days.

(21) Appl. No.: 16/859,363

(22) Filed: Apr. 27, 2020

(65) Prior Publication Data
US 2021/0336319 A1    Oct. 28, 2021

(51) Int. Cl.
*C25D 5/12*    (2006.01)
*C25D 5/38*    (2006.01)
(Continued)

(52) U.S. Cl.
CPC ............ *H01P 3/06* (2013.01); *B23K 35/40* (2013.01); *B23K 35/404* (2013.01); *C25D 5/12* (2013.01); *C25D 5/38* (2013.01); *C25D 7/0607* (2013.01); *G06N 10/00* (2019.01); *H01P 11/005* (2013.01); *H10N 69/00* (2023.02); *B23K 2103/166* (2018.08)

(58) Field of Classification Search
CPC ... C25D 5/10; C25D 5/12; C25D 5/38; C25D 5/34; C25D 7/0607; B23K 35/40; B23K 35/404; B23K 2103/00; B23K 2103/166; B32K 2103/14

USPC ................ 205/170, 181, 182, 206, 212, 210
See application file for complete search history.

(56) References Cited

U.S. PATENT DOCUMENTS 3,057,048 A    10/1962  Hirakis
3,167,692 A     1/1965  Matthias
(Continued)

FOREIGN PATENT DOCUMENTS

CN    102173449 A  *  9/2011  ............. C01G 21/08
CN    105870026 A  *  8/2016  ............. H01L 23/12
(Continued)

OTHER PUBLICATIONS

Baker et al., "An Experimental Study of Metal Polishing by Flexible Polishing Wheels," Transactions of the Electrochemical Society (1931), vol. 59, No. 1, pp. 483-498. (Year: 1931).*

(Continued)

*Primary Examiner* — Edna Wong
(74) *Attorney, Agent, or Firm* — Amin, Turocy & Watson, LLP

(57) ABSTRACT

Devices, systems, and/or methods that can facilitate plating one or more metal layers onto a niobium-titanium substrate are provided. According to an embodiment, a device can comprise a niobium-titanium substrate. The device can further comprise a first metal layer plated on a portion of the niobium-titanium substrate. The device can further comprise a second metal layer plated on the first metal layer. The device can further comprise a third metal layer plated on the second metal layer.

4 Claims, 10 Drawing Sheets

(51) Int. Cl.
*B23K 35/40* (2006.01)
*H01P 3/06* (2006.01)
*H01P 11/00* (2006.01)
*G06N 10/00* (2022.01)
*H10N 69/00* (2023.01)
*C25D 7/06* (2006.01)
*B23K 103/16* (2006.01)

(56) References Cited

U.S. PATENT DOCUMENTS

| | | | |
|---|---|---|---|
| 3,328,271 | A | 6/1967 | Kneip, Jr. et al. |
| 3,708,866 | A | 1/1973 | Wells |
| 4,686,017 | A * | 8/1987 | Young .................... C05C 9/00 205/267 |
| 4,942,379 | A * | 7/1990 | Ogawa .................... H01L 39/14 324/318 |
| 4,964,967 | A * | 10/1990 | Hashimoto ............ B23K 35/32 204/292 |
| 6,527,924 | B1 | 3/2003 | Andolfatto et al. |
| 6,932,874 | B2 | 8/2005 | Marancik et al. |
| 9,006,147 | B2 | 4/2015 | Taylor et al. |
| 10,141,493 | B2 | 11/2018 | Tuckerman |
| 2005/0103519 | A1 | 5/2005 | Brandsberg et al. |
| 2006/0225918 | A1* | 10/2006 | Chinda ................. H01L 21/568 29/841 |
| 2008/0163474 | A1 | 7/2008 | Hong et al. |
| 2009/0082865 | A1* | 3/2009 | Raja ....................... C25D 11/26 205/171 |
| 2012/0304694 | A1 | 12/2012 | Derrig |
| 2017/0321069 | A1 | 11/2017 | Zhao et al. |
| 2019/0279792 | A1* | 9/2019 | DeBry .................... C25D 11/30 |

FOREIGN PATENT DOCUMENTS

| | | | | |
|---|---|---|---|---|
| EP | 895284 | A1 * | 2/1999 | ........... H01L 23/142 |
| JP | 04065032 | A * | 3/1992 | ............. H01B 12/10 |
| JP | 07094624 | A * | 4/1995 | ............. H01L 23/12 |
| JP | 2604379 | B2 * | 1/1997 | ............. Y02E 40/60 |
| JP | 4258397 | B2 * | 4/2009 | ............. H01B 13/00 |

OTHER PUBLICATIONS

"Material Technical Data," Magnetic Shields Electromagnetic Engineering, https://magneticshields.co.uk/technical/material-technical-data, 3 pages.

Baudrand, "Plating Onto "Difficult-To-Plate" Metals," Guest Editorial for Plateworld.com, http://www.plateworld.com/editorial16.htm, 5 pages.

Kushner, "Platinum on Niobium and Titanium," Experts Post: Jul. 1, 2008, https://www.pfonline.com/articles/platinum-on-niobium-and-titanium, 1 page.

Tian, et al., "The Mechanism of Electropolishing of Niobium in Hydrofluoric-Sulfuric Acid Electrolyte," Journal of The Electrochemical Society, 155 (9) pp. 563-568, (2008).

Non-Final Office Action received for U.S. Appl. No. 16/170,760 dated Apr. 2, 2020, 21 pages.

Appendix P—List of IBM Patents or Applications treated as related.

Non-Final Office Action received for U.S. Appl. No. 16/170,760 dated Sep. 18, 2021, 20 pages.

* cited by examiner

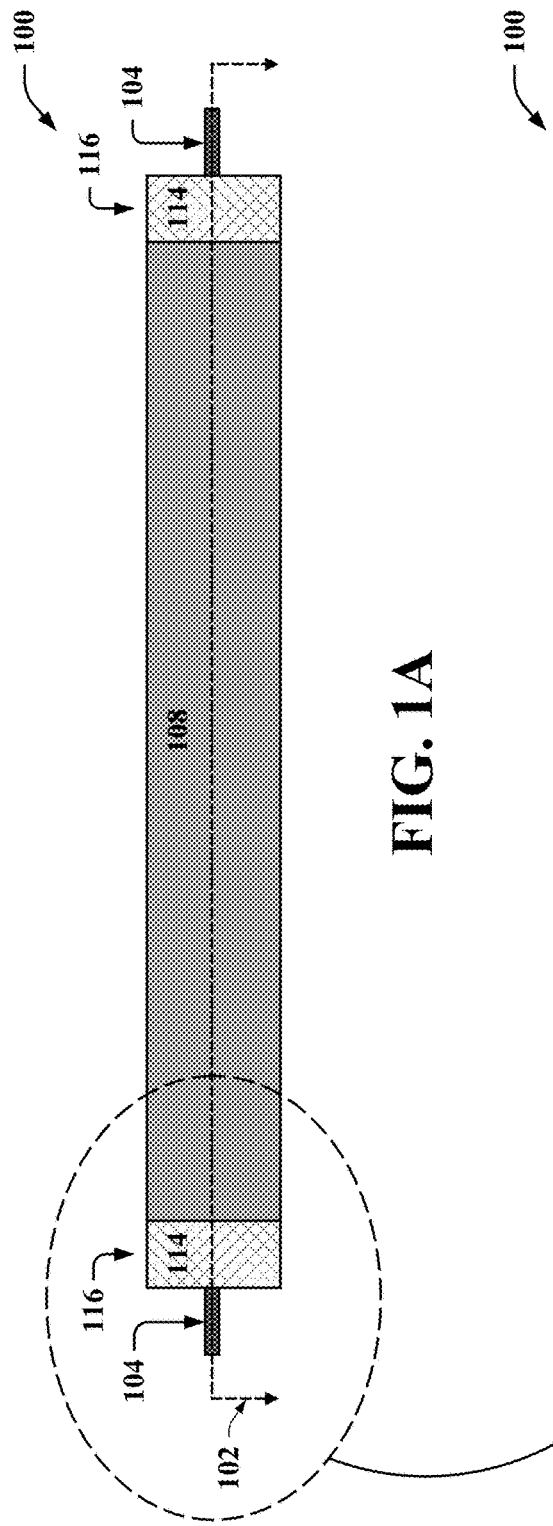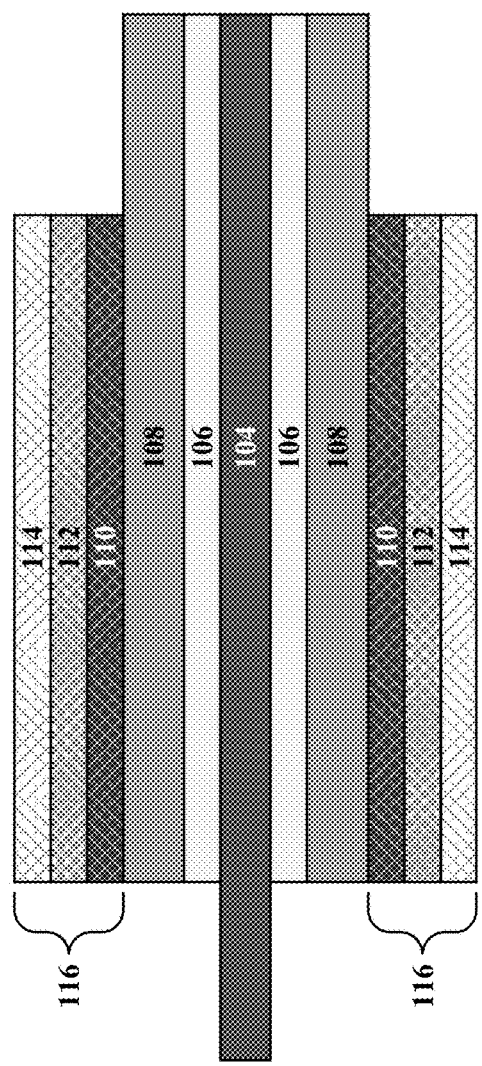
FIG. 1A
FIG. 1B

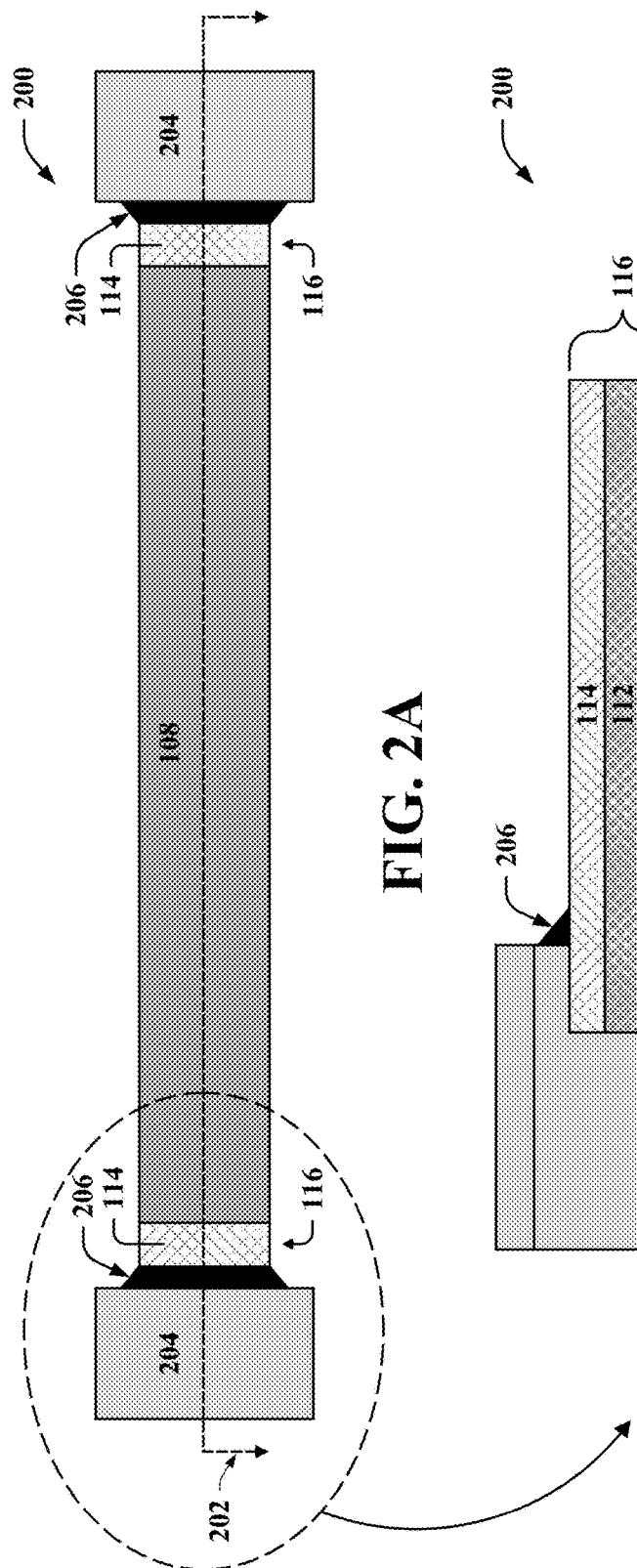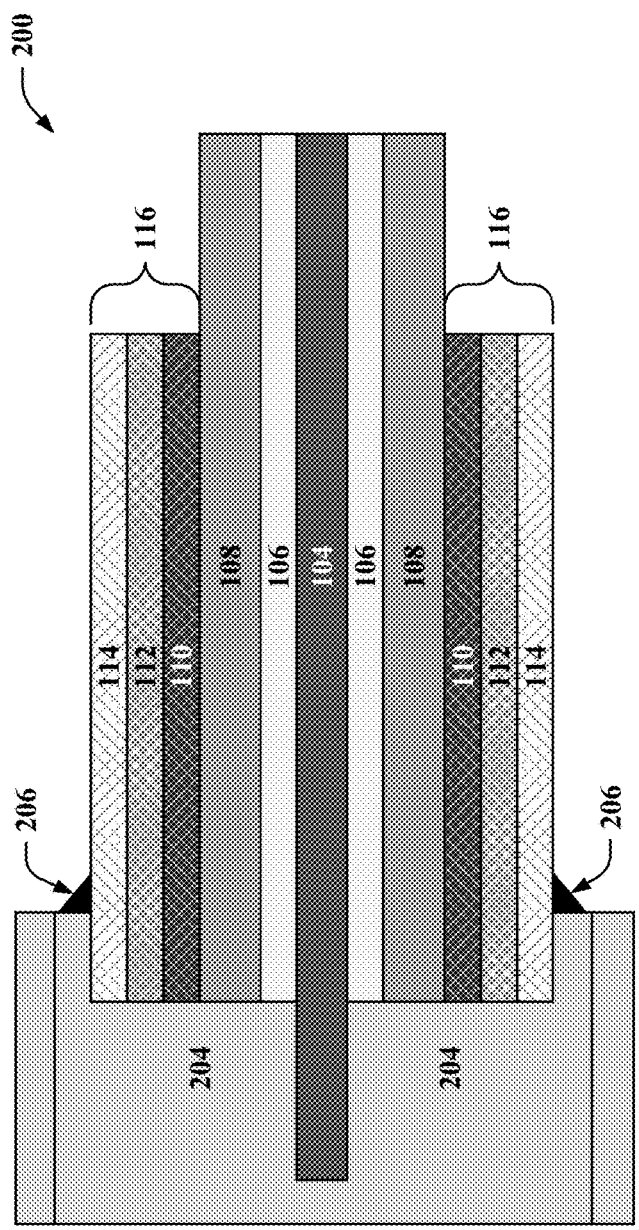
FIG. 2A
FIG. 2B

ELECTROPLATED METAL LAYER ON A NIOBIUM-TITANIUM SUBSTRATE

BACKGROUND

The subject disclosure relates to electroplating upon niobium-titanium (NbTi), and more specifically, to electroplating upon NbTi with a solderable metal.

A problem with the present state of the art for using a NbTi substrate, for instance, as a NbTi coaxial cable in various electronic circuit applications, is that the NbTi metal forms an incredibly tough, hard oxide layer whenever it is heated above room temperature. This oxide prevents the NbTi metal from being soldered in any normal fashion except under a high vacuum or with ultrasonic soldering. Additionally, a problem with the present state of the art for using a coaxial cable in electronic circuit applications such as, for instance, a quantum-computing system that utilizes a dilution refrigerator is that the low temperatures and the pathway of the dilution refrigerator preclude the use of a low-electrical-loss copper coax, and the use of common connections such as, for instance, high-resistance stainless steel and/or cupro-nickel coax connections results in far too much attenuation (e.g., electrical resistance) for this application.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, computer-implemented methods, apparatus, and/or computer program products that facilitate plating one or more metal layers onto a niobium-titanium substrate are described.

According to an embodiment, a device can comprise a niobium-titanium substrate. The device can further comprise a first metal layer plated on a portion of the niobium-titanium substrate. The device can further comprise a second metal layer plated on the first metal layer. The device can further comprise a third metal layer plated on the second metal layer. An advantage of such a device is that it can facilitate improved adhesion of the first metal layer, the second metal layer, and/or the third metal layer to the niobium-titanium substrate, as well as improved thermal conductivity or reduced oxidation of the device.

In some embodiments, the device above can further comprise a metal contact surface (e.g., a metal connector) soldered to at least one of the first metal layer, the second metal layer, or the third metal layer. An advantage of such a device is that it can be implemented as a niobium-titanium coaxial cable device that can operate at ultra-low temperatures (e.g., less than 1.0 Kelvin) while facilitating improved signal transmission (e.g., microwave signal transmission), reduced attenuation, constant impedance, and/or reduced or no undesirable signal reflections (e.g., undesirable microwave signal reflections).

According to an embodiment, a device can comprise a niobium-titanium wire. The device can further comprise a first metal layer plated on a portion of the niobium-titanium wire. The device can further comprise a second metal layer plated on the first metal layer. The device can further comprise a third metal layer plated on the second metal layer. The device can further comprise a metal coaxial connector soldered to the third metal layer. An advantage of such a device is that it can facilitate improved adhesion of the first metal layer, the second metal layer, the third metal layer, and/or the metal coaxial connector to the niobium-titanium wire, as well as improved thermal conductivity or reduced oxidation of the device.

In some embodiments, the metal coaxial connector comprises a microwave connector. An advantage of such a device is that it can be implemented as a niobium-titanium coaxial cable device that can operate at ultra-low temperatures (e.g., less than 1.0 Kelvin) while facilitating improved signal transmission (e.g., microwave signal transmission), reduced attenuation, constant impedance, and/or reduced or no undesirable signal reflections (e.g., undesirable microwave signal reflections).

According to an embodiment, a method can comprise electroplating a first metal film onto a surface of a niobium-titanium substrate. The method can further comprise electroplating a second metal film onto the first metal film. The method can further comprise electroplating a third metal film onto the second metal film. An advantage of such a method is that it can be implemented to facilitate improved adhesion of the first metal film, the second metal film, and/or the third metal film to the niobium-titanium substrate, as well as, improved thermal conductivity or reduced oxidation of the niobium-titanium substrate.

In some embodiments, the method above can further comprise soldering a metal surface to at least one of the first metal film, the second metal film, or the third metal film. An advantage of such a method is that it can be implemented to fabricate a niobium-titanium coaxial cable device that can operate at ultra-low-temperatures (e.g., less than 1.0 Kelvin) while facilitating improved signal transmission (e.g., microwave signal transmission), reduced attenuation, constant impedance, and/or reduced or no undesirable signal reflections (e.g., undesirable microwave signal reflections).

DESCRIPTION OF THE DRAWINGS

FIGS. 1A and 1B illustrate a top view and a cross-sectional view, respectively, of an example, non-limiting device comprising a niobium-titanium substrate with a metal layer plated onto a surface of the niobium-titanium substrate in accordance with one or more embodiments described herein.

FIGS. 2A and 2B illustrate a top view and a cross-sectional view, respectively, of the example, non-limiting device of FIGS. 1A and 1B after coupling one or more metal objects to the metal layer in accordance with one or more embodiments described herein.

DETAILED DESCRIPTION

Figure 3:
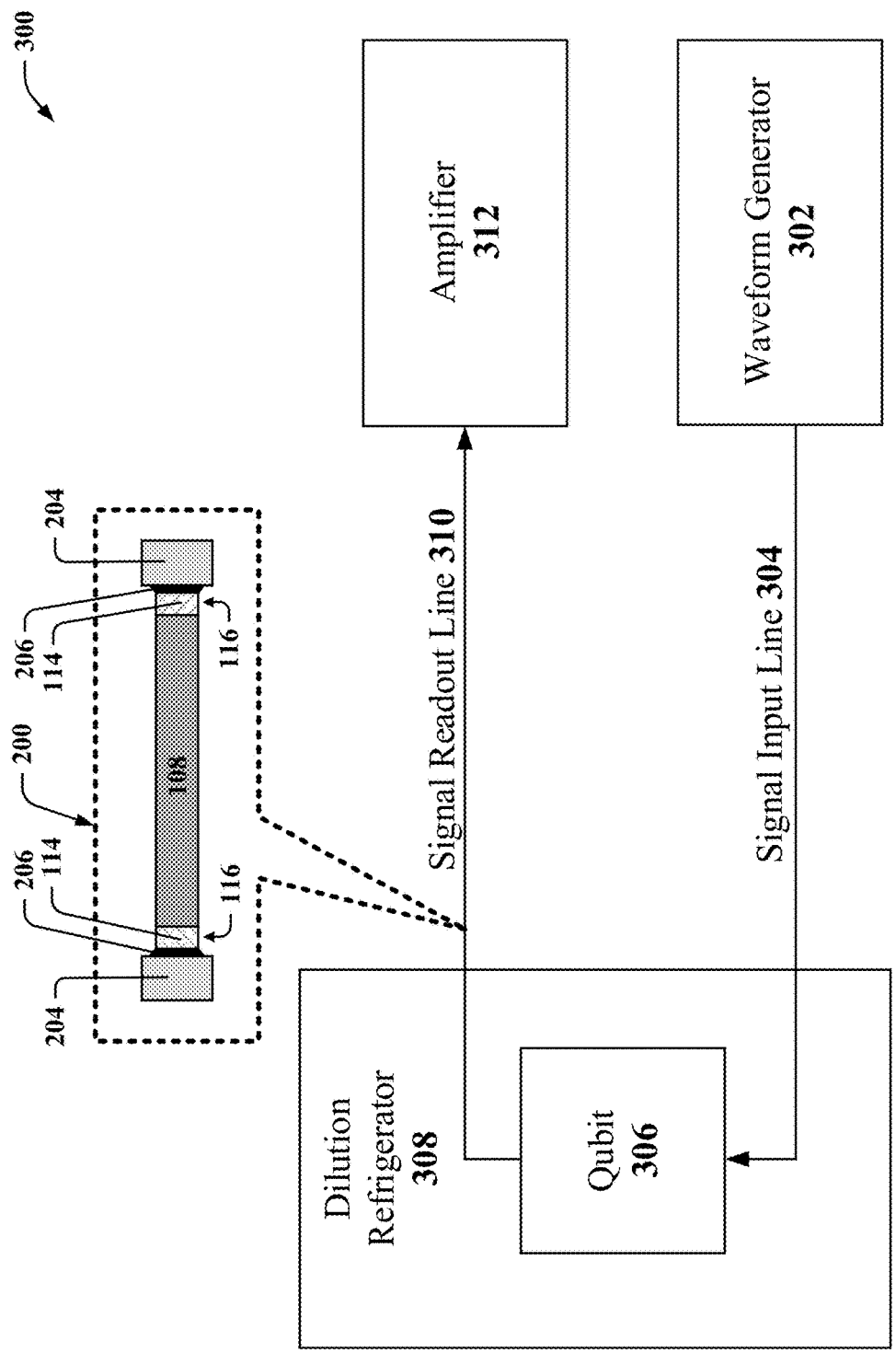
FIG. 3 illustrates a block diagram of an example, non-limiting system that can facilitate a qubit-readout procedure using a niobium-titanium cable assembly in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments of the subject disclosure are directed to plating a material capable of being soldered (hereinafter, a "solderable" material) onto the exterior surface of a coaxial cable formed with a metal material (e.g., an alloy) comprising niobium (Nb) and titanium (Ti).

Given the problems described above with prior-art technologies, the present disclosure can be implemented to produce a solution to these problems in the form of devices, systems, and/or methods (e.g., computer-implemented methods, fabrication methods, etc.) that can facilitate plating one or more metal layers onto a niobium-titanium substrate. An advantage of such devices, systems, and/or methods is that they can facilitate improved adhesion to the niobium-titanium substrate, as well as improved thermal conductivity or reduced oxidation of a device comprising the niobium-titanium substrate.

In some embodiments, the present disclosure can be implemented to produce a solution to the problems described above in the form of devices, systems, and/or methods (e.g., computer-implemented methods, fabrication methods, etc.) that can facilitate soldering of a metal structure (e.g., a metal connector) directly to one or more metal layers plated onto a niobium-titanium substrate of a niobium-titanium coaxial cable device. An advantage of such devices, systems, and/or methods is that they can facilitate operation of such a niobium-titanium coaxial cable device at ultra-low-temperatures (e.g., less than 1.0 Kelvin) while facilitating improved signal transmission (e.g., microwave signal transmission), reduced attenuation, constant impedance, and/or reduced or no undesirable signal reflections (e.g., undesirable microwave signal reflections).

Various embodiments of the subject disclosure describe techniques to form a metal layer that can constitute a solderable material, where such a metal layer can comprise one or more metal layers including, but not limited to, a nickel (Ni) layer, a copper (Cu) layer, and/or a gold (Au) layer that can be plated onto the surface of a NbTi coaxial cable using one or more electroplating processes. In one or more embodiments, a mechanical polishing wheel can be initially used to remove oxidation and foreign material from the NbTi coaxial cable surface, followed by a manual sanding to roughen the surface. In some embodiments, the NbTi coaxial cable can further be dipped into a hydrochloric acid (HCl) solution to clean the surface and remove any residual debris. In some embodiments, one or more electroplating processes can then be performed to deposit one or more layers of solderable metal onto the prepared surface of the cable. In these embodiments, such one or more electroplating processes can involve a standard electrolysis plating process, wherein the prepared surface of the coaxial cable is placed in a metal sulfamate bath. Notably, by using the disclosed plating procedures described herein, the one or more deposited metal layers facilitate improved adhesion to the prepared surface of the NbTi coaxial cable without usage of a nickel strike or wood strike step used in association with the electroplating processes described herein.

As the metal layer described above is both solderable and has excellent mechanical adhesion to the parent NbTi metal, a metal connector can be attached to the metal layer using the same or similar soldering techniques employed for standard copper coaxial cables. In this regard, in one or more embodiments, after the metal layer has been electroplated onto the NbTi cable, a metal connector can be soldered directly onto the metal layer, thereby forming a NbTi coaxial-cable assembly. In various embodiments, the metal connector can comprise a standard microwave connector such as, for instance, a sub-miniature version A (SMA) type connector. In such embodiments, the coaxial cable assembly can operate at ultra-low-temperatures (e.g., less than 1.0 Kelvin) while facilitating improved signal transmission (e.g., microwave signal transmission), reduced attenuation, constant impedance, and/or reduced or no undesirable signal reflections (e.g., undesirable microwave signal reflections). In these embodiments, the mechanical strength at all temperatures is likewise indistinguishable from an existing terminated copper coaxial line. Accordingly, in various embodiments, the disclosed NbTi cable assembly can serve as an improved waveguide for superconducting quantum-bit (qubit) circuits.

Some embodiments of the subject disclosure described herein are particularly directed to electroplating a NbTi coaxial cable or wire with a solderable metal for the purpose of soldering a connecter thereto to form a coaxial cable assembly capable of being used for electronic circuit applications such as, for instance, usage as a waveguide to facilitate qubit readout. However, the disclosed techniques are not limited to this specific application. For example, the disclosed techniques can be used to plate the metal layer described above onto various types of NbTi substrates and/or to solder various types of metal objects and/or objects comprising metal surfaces to the metal layer.

One or more embodiments are now described with reference to the drawings, wherein like referenced numerals are used to refer to like elements throughout. It should be appreciated that the drawings of the present application are provided for illustrative purposes only and, as such, the drawings are not drawn to scale. In the following description, for purposes of explanation, numerous specific details are set forth in order to provide a more thorough understanding of the one or more embodiments. It is evident, however, in various cases, that the one or more embodiments can be practiced without these specific details. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

As used herein, unless otherwise specified, terms such as on, over, overlying, atop, on top, positioned on, and/or positioned atop mean that a first element is present on a second element, wherein intervening elements may be present between the first element and the second element. As used herein, unless otherwise specified, the term directly used in connection with the terms on, over, overlying, atop, on top, positioned, positioned atop, contacting, directly contacting, and/or the term direct contact, mean that a first element and a second element are connected without any intervening elements, such as, for example, intermediary conducting, insulating, semiconductor, and/or superconductor layers, present between the first element and the second element. As used herein, when an element is referred to as being beneath or under another element, it can be directly beneath or under the other element, or intervening elements may be present. In contrast, as used herein, when an element is referred to as being "directly beneath" or "directly under" another element, there are no intervening elements present.

As used herein, terms such as upper, lower, above, below, directly above, directly below, aligned with, adjacent to, right, left, vertical, horizontal, top, bottom, and derivatives thereof shall relate to the disclosed devices as oriented in the figures. As used herein, when an element is referred to as being "coupled" to another element, it can describe one or more different types of coupling including, but not limited to, chemical coupling, communicative coupling, electrical coupling, electromagnetic coupling, operative coupling, optical coupling, physical coupling, thermal coupling, and/or another type of coupling.

FIG. 1A illustrates a top view of an example, non-limiting device 100 comprising a NbTi substrate with a metal layer plated onto a surface of the NbTi substrate in accordance with one or more embodiments described herein. FIG. 1B illustrates a cross-sectional side view of a portion of device 100 as viewed along a plane defined by line 102.

In the embodiment illustrated in FIGS. 1A and 1B, device 100 can comprise a coaxial cable and/or wire (also referred to herein as a cable, a coax, and/or the like). For example, device 100 can comprise a coaxial cable and/or wire that can comprise an inter-conductor layer 104 formed within and surrounded by an insulator layer 106 and/or a substrate layer 108. Substrate layer 108 can comprise an outer jacket layer of device 100 formed around insulator layer 106 as illustrated in the inset view of an end of device 100 depicted in FIG. 1B. Inter-conductor layer 104 can comprise a wire (e.g., a solid wire) that can be formed using a NbTi alloy. Insulator layer 106 formed between substrate layer 108 and inter-conductor layer 104 can comprise an insulating material including, but not limited to, polytetrafluoroethylene and/or another insulating material. Substrate layer 108 can comprise a metal tube that can be formed using a NbTi alloy. For example, substrate layer 108 can comprise a NbTi sheath, a NbTi substrate, and/or another metal tube formed using a NbTi alloy. The dimensions of device 100, and/or one or more components thereof, can vary. For instance, in an example embodiment, device 100 can have a length of approximately 1.0 meter (m) and a diameter ranging from approximately 2.0 millimeters (mm) to approximately 5.0 mm. In an embodiment, device 100 can have a diameter of approximately 2.18 mm.

As illustrated in FIGS. 1A and 1B, device 100 can further comprise a metal layer 116 plated onto one or more portions of a surface (e.g., an outer surface) of substrate layer 108 using electroplating after such one or more portions of such a surface of substrate layer 108 have been prepared in accordance with the techniques described herein. Metal layer 116 can constitute a thin film and/or coating that can be adhered to the surface of the substrate layer 108. In the embodiment illustrated in FIGS. 1A and 1B, metal layer 116 can be formed on both ends (e.g., distal ends) of device 100 to enable attachment of coaxial connectors to both ends of device 100. However, the position and configuration of metal layer 116 on the surface of substrate layer 108 can vary. For example, in some embodiments, metal layer 116 can be formed on only one end of device 100. In other embodiments, metal layer 116 can be formed at more than two locations on the surface of substrate layer 108. Still in other embodiments, an entirety of the surface of the substrate layer 108 can be coated with metal layer 116.

Additionally, or alternatively, although not illustrated in the figures, in some embodiments, metal layer 116 can be formed on substrate layer 108 at one or more locations along the axis of device 100. For instance, in some embodiments, metal layer 116 can be formed on substrate layer 108 at a midpoint defined along the axis of device 100 (e.g., at the center of device 100). In these embodiments, a metal object such as, for instance, a thermal sink bracket (e.g., a Cu thermal sink bracket) can be soldered to metal layer 116 (e.g., using a metal-to-metal soldering technique as described below). In these embodiments, such a thermal sink bracket (e.g., a Cu thermal sink bracket) can be soldered to metal layer 116 to facilitate improved thermal conductivity of device 100 and/or one or more components thereof.

The dimensions and/or configuration (e.g., shape) of metal layer 116 can vary. For example, in the embodiment illustrated in FIGS. 1A and 1B, metal layer 116 can be formed as a continuous ring around the perimeter of one or more ends of device 100. In other example embodiments, metal layer 116 can be discontinuous.

Metal layer 116 can comprise one or more solderable metals that can be soldered to using one or more metal-to-metal soldering techniques (e.g., a Cu to Au soldering technique). For example, as illustrated in the embodiment depicted in FIGS. 1A and 1B, metal layer 116 can comprise: a first metal layer 110 adhered to (e.g., directly adhered to) a surface (e.g., an outer surface) of substrate layer 108; a second metal layer 112 adhered to (e.g., directly adhered to) a surface (e.g., an outer surface) of first metal layer 110; and a third metal layer 114 adhered to (e.g., directly adhered to) a surface (e.g., an outer surface) of second metal layer 112. In various embodiments, first metal layer 110 can serve as a seed layer for the electrodeposition of second metal layer 112 thereon and second metal layer 112 can serve as another seed layer for the electrodeposition of third metal layer 114 thereon.

In an embodiment, first metal layer 110 can comprise a layer of Ni that can be formed directly on and contacting a surface of one or more portions of substrate layer 108 using a first electroplating process described in the example plating procedure below. In another embodiment, second metal layer 112 can comprise a layer of Cu that can be formed directly on and contacting a surface of first metal layer 110 using a second electroplating process described in the example plating procedure below. In another embodiment, third metal layer 114 can comprise a layer of Au that can be formed directly on and contacting a surface of second metal layer 112 using a third electroplating process described in the example plating procedure below. Other suitable metals that can be electroplated onto the surface of one or more portions of substrate layer 108 to form metal layer 116 can include, but are not limited to, cobalt (Co), chromium (Cr), silver (Ag), and/or iron (Fe).

Procedure to Plate Metal Layers onto NbTi Substrate

The following example plating procedure can be implemented to facilitate electroplating one or more metal layers onto a NbTi substrate. For instance, the following example plating procedure can be implemented to facilitate electroplating metal layer 116, comprising first metal layer 110, second metal layer 112, and/or third metal layer 114, onto substrate layer 108 of device 100. In this example: the first electroplating process described above that can be implemented to form first metal layer 110 on substrate layer 108 can correspond to steps 1-12 and 19-24 below, where substrate layer 108 comprises a NbTi substrate and first metal layer 110 comprises Ni in this example procedure; the second electroplating process described above that can be implemented to form second metal layer 112 on first metal layer 110 can correspond to steps 1-15 and 19-24 below, where first metal layer 110 comprises Ni and second metal layer 112 comprises Cu in this example procedure; and/or the third electroplating process described above that can be implemented to form third metal layer 114 on second metal layer 112 can correspond to steps 1-24 below, where second metal layer 112 comprises Cu and third metal layer 114 comprises Au in this example procedure. Additionally, or alternatively, it should be noted that the NbTi cable referenced in the example plating procedure below can comprise a NbTi substrate (e.g., substrate layer 108, a NbTi coaxial cable, a NbTi wire, a NbTi sheath, etc.) that can be developed into device 100 (and/or device 200 described below with reference to FIGS. 2A and 2B) by implementing this example plating procedure.

Step 1: Polish NbTi cable with polishing wheel. Polish approximately 25 mm from one or both ends of the NbTi cable.

Step 2: Sand polish one or both ends of NbTi cable with sandpaper (e.g., 320 grit sandpaper or emery paper).

Step 3: Soak NbTi cable in ethanol to remove any excess polished or sanded metal from the surface of the cable.

Step 4: Mask NbTi cable with platers tape (also referred to as plating tape) to expose approximately 20 mm of one or both ends of the NbTi cable. Only exposed area will be plated later.

Step 5: Apply masking liquid (e.g., stop-off lacquer) to the tip of one or both ends of the NbTi cable. This will prevent plating of the inner NbTi layer (e.g., inter-conductor layer 104). Make sure to only mask the exposed inner layer (e.g., exposed inter-conductor layer 104) and not to cover any of the outer NbTi metal (e.g., substrate layer 108).

Step 6: Mount NbTi cable onto a plating fixture.

Step 7: Rinse NbTi cable and/or plating fixture with deionized (DI) water (e.g., for 10 seconds).

Step 8: Soak NbTi cable and/or plating fixture in 50 percent (%) hydrochloric acid solution (e.g., for 2 minutes).

Step 9: Rinse NbTi cable and/or plating fixture with DI water (e.g., for 3 minutes).

Step 10: Set plating parameters for Ni plating (e.g., 10 amps per square foot (amps/ft$^2$ or ASF), for 20 minutes, where the ASF corresponds to current flow in anodizing and metal plating processes). Thickness: approximately 2-3 microns (micrometers (μm)).

Step 11: Make electrical connection and plate NbTi cable and/or plating fixture with Ni.

Step 12: Rinse NbTi cable and/or plating fixture in DI water (e.g., for 2 minutes).

Step 13: Set plating parameters for Cu plating (e.g., 25 ASF, for 5 minutes). Thickness: approximately 10-15 μm.

Step 14: Make electrical connection and plate NbTi cable and/or plating fixture with Cu.

Step 15: Rinse NbTi cable and/or plating fixture in DI water (e.g., for 2 minutes).

Step 16: Set plating parameters for Au plating (e.g., 3 ASF, 5 minutes). Thickness: approximately 0.1-0.2 μm.

Step 17: Make electrical connection and plate NbTi cable and/or plating fixture with Au.

Step 18: Rinse NbTi cable and/or plating fixture in DI water (e.g., for 2 minutes).

Step 19: Dry NbTi cable and/or plating fixture with clean nitrogen spray device ($N_2$ spray device).

Step 20: Remove NbTi cable from the plating fixture.

Step 21: Use tape test to check if adhesion of Ni, Cu, and/or Au on NbTi is good. If adhesion is good, proceed to step 22; if not, repeat steps 1-20.

Step 22: Remove platers tape.

Step 23: Remove masking liquid by soaking NbTi cable in acetone (e.g., for 5-10 minutes).

Step 24: Place plated NbTi cable in a nitrogen box.

The various surface preparation operations of steps 1-9 in the example plating procedure described above can facilitate adhesion of one or more electroplated metals (e.g., first metal layer 110, second metal layer 112, third metal layer 114, etc.) onto the surface of a NbTi substrate (e.g., substrate layer 108 of device 100). In one or more embodiments, as described in the example plating procedure above, such surface preparation operations can involve using a mechanical polishing wheel to mechanically polish a portion of a NbTi substrate surface to be plated (e.g., substrate layer 108 of device 100). This mechanical polishing can remove oxidation and/or foreign material from the surface of the NbTi substrate (e.g., substrate layer 108). In some embodiments, the mechanical polishing can involve contacting the portion of such a NbTi substrate to be plated with the mechanical polishing wheel for a relatively short duration (e.g., 5.0 to 20.0 seconds, which can vary depending on the size of the area to be plated). For example, in embodiments in which the NbTi substrate comprises a NbTi cable and/or wire (e.g., a NbTi coaxial cable and/or wire such as, for instance, device 100), one or both ends (e.g., a distal end(s)) of such a NbTi cable and/or wire can be held against the mechanical polishing wheel while rotating the NbTi cable and/or wire to ensure the entire circumference of the NbTi cable and/or wire is polished. Based on such mechanical polishing, the preparation can further involve sanding the polished surface to roughen the surface (e.g., to create an abrasive surface). In various embodiments, the sanding can involve automated and/or manual sanding with sandpaper having a certain grit value. For example, in one or more embodiments, the sandpaper can have a grit value between approximately 40 grit and 220 grit.

The various surface preparation operations of steps 1-9 in the example plating procedure described above can further include dipping the sanded NbTi substrate (e.g., sanded substrate layer 108 of device 100) into a hydrochloric acid (HCl) solution (e.g., a 1:1 HCl solution) to clean the surface and remove any residual debris. For example, in one embodiment, the sanded NbTi substrate can be submerged in the HCl solution for about 2.0 minutes. In embodiments in which the NbTi substrate comprises a NbTi coaxial cable and/or wire, a coating of stop-off lacquer can be applied to the exposed ends (e.g., distal ends) of the NbTi coaxial cable and/or wire to protect its properties during plating (e.g., the properties of inter-conductor layer 104). In these embodiments, the stop-off lacquer can be applied before the HCl dip. The HCl dipped NbTi substrate can further be rinsed (e.g., for about 10 seconds) with DI water before electroplating.

Based on such surface preparation of a surface on the NbTi substrate (e.g., substrate layer 108) in accordance with the techniques described above, the electroplating of first metal layer 110, second metal layer 112, and/or third metal layer 114 can be performed to form a layer (e.g., metal layer 116) of solderable metal onto the prepared surface of the NbTi substrate. The electroplating operations of steps 10-18 in the example plating procedure described above can involve a standard electrolysis plating process that involves placing the prepared surface of the NbTi substrate (e.g. substrate layer 108) in a metal sulfamate bath.

In one or more example embodiments in which the NbTi substrate comprises a NbTi coaxial cable and/or wire (e.g., device 100), the prepared end(s) of the NbTi coaxial cable and/or wire can be electroplated with Ni using a Ni sulfamate bath to form first metal layer 110 on the prepared surface(s) of the NbTi coaxial cable and/or wire. In one embodiment, the amps per square feet (ASF) used for the Ni sulfamate bath can be approximately 10. In accordance with this embodiment, the electroplating can be performed for approximately 20 minutes to deposit about 2.0-3.0 µm of Ni onto the submerged surface of the NbTi coaxial cable and/or wire. In some embodiments, the NbTi coaxial cable and/or wire can be cleansed to remove unbound Ni formed on the unprepared portion of the surface of the NbTi coaxial cable and/or wire. In this regard, Ni deposited on a portion of the NbTi coaxial cable and/or wire that was not prepared in accordance with the techniques described above can be removed by a simple tape test. However, the Ni adheres strongly to the prepared surface of the NbTi coaxial cable and/or wire, even without usage of a nickel or wood strike step used in association with the electroplating.

In another example embodiment, a second electroplating process can be applied to the Ni plated NbTi coaxial cable and/or wire (e.g., substrate layer 108 electroplated with first metal layer 110) to form second metal layer 112 (e.g., comprising Cu) on first metal layer 110 (e.g., comprising Ni). In this regard, first metal layer 110 of the NbTi substrate can server as a seed layer for the plating of second metal layer 112 directly thereto with strong adhesion. For example, the end(s) of the NbTi coaxial cable and/or wire plated with first metal layer 110 can be electroplated with second metal layer 112 (e.g., comprising Cu) using a Cu sulfamate bath. In one embodiment, the ASF used for the Cu sulfamate bath can be approximately 25. In accordance with this embodiment, the electroplating can be performed for about 5.0 minutes to deposit about 10.0-15.0 µm of Cu on first metal layer 110 plated on the NbTi coaxial cable and/or wire. In some embodiments, the NbTi coaxial cable and/or wire can be cleansed to remove unbound Cu formed on the unprepared surface of the NbTi coaxial cable and/or wire. In this regard, Cu deposited on a portion of the NbTi coaxial cable and/or wire that was not prepared and/or coated with first metal layer 110 in accordance with the techniques described above can also be removed by the simple tape test. However, the Cu of second metal layer 112 adheres strongly to the Ni of first metal layer 110 plated on the surface of the NbTi coaxial cable and/or wire, even without usage of a nickel or wood strike step used in association with the electroplating.

In another example embodiment, a third electroplating process can be applied to the Cu plated NbTi coaxial cable and/or wire (e.g., substrate layer 108 electroplated with second metal layer 112) to form third metal layer 114 (e.g., comprising Au) on second metal layer 112 (e.g., comprising Cu). In this regard, second metal layer 112 of the NbTi substrate can server as a seed layer for the plating of third metal layer 114 directly thereto with strong adhesion. For example, the end(s) of the NbTi coaxial cable and/or wire plated with second metal layer 112 can be electroplated with third metal layer 114 (e.g., comprising Au) using a Au sulfamate bath. In one embodiment, the ASF used for the Au sulfamate bath can be approximately 3. In accordance with this embodiment, the electroplating can be performed for about 5.0 minutes to deposit about 0.1-0.2 µm of Au on second metal layer 112 plated on the NbTi coaxial cable and/or wire. In some embodiments, the NbTi coaxial cable and/or wire can be cleansed to remove unbound Au formed on the unprepared surface of the NbTi coaxial cable and/or wire. In this regard, Au deposited on a portion of the NbTi coaxial cable and/or wire that was not prepared and/or coated with second metal layer 112 in accordance with the techniques described above can also be removed by the simple tape test. However, the Au of third metal layer 114 adheres strongly to the Cu of second metal layer 112 plated on the surface of the NbTi coaxial cable and/or wire, even without usage of a nickel or wood strike step used in association with the electroplating.

Based on removal of any remaining unbound Ni, Cu, and/or Au in accordance with the techniques described above, a metal object (e.g., a metal connector 204) can be soldered directly to the Au of third metal layer 114 plated on the NbTi coaxial cable and/or wire. For example, such a metal object (e.g., a metal connector 204) can be soldered to the metal film (e.g., metal layer 116) comprising first metal layer 110, second metal layer 112, and/or third metal layer 114 formed on the NbTi coaxial cable and/or wire as described above. In one embodiment, such a metal object (e.g., a metal connector 204) can be soldered directly to the Au of third metal layer 114 plated on the NbTi coaxial cable and/or wire using a standard low temperature soldering technique (e.g., involving the use of flux such as rosin or acid, with heat typically less than 350° C.) and/or a metal to metal soldering technique, as well as a low temperature solder material (e.g., lead/tin, silver/tin, and the like) as described below with reference to FIGS. 2A and 2B.

In various embodiments, first metal layer 110 can comprise a thickness (e.g., height) ranging from approximately 2 µm to approximately 5 µm. For instance, as described in the example plating procedure above, in one embodiment, first metal layer 110 can comprise a thickness (e.g., height) ranging from approximately 2 µm to approximately 3 µm and/or a length (e.g., as measured along the axis of device 100) of approximately 20 mm.

In various embodiments, second metal layer 112 can comprise a thickness (e.g., height) ranging from approximately 10 µm to approximately 20 µm. For instance, as described in the example plating procedure above, in one embodiment, second metal layer 112 can comprise a thickness (e.g., height) ranging from approximately 10 µm to approximately 15 µm and/or a length (e.g., as measured along the axis of device 100) of approximately 20 mm.

In various embodiments, third metal layer 114 can comprise a thickness (e.g., height) ranging from approximately 0.1 µm to approximately 0.5 µm. For instance, as described in the example plating procedure above, in one embodiment, third metal layer 114 can comprise a thickness (e.g., height) ranging from approximately 0.1 µm to approximately 0.2 µm and/or a length (e.g., as measured along the axis of device 100) of approximately 20 mm.

A major technological hurdle to using a NbTi material as a coaxial waveguide for superconducting qubits and/or for other electronic circuit applications is that the NbTi metal forms a tough, hard oxide layer on its surfaces whenever it is heated above room temperature. This oxide layer prevents the NbTi metal from being soldered in any normal fashion except under a high vacuum. Another approach involves using an ultrasonic soldering iron to break down the oxide layer on the NbTi metal to render it solderable. This approach does not provide a mechanically strong solder joint because the solder does not wet the NbTi metal fully, and the type of solder material that can be used is restricted. Another approach is to swage a solderable sleeve on to the exterior of the coax waveguide (e.g., onto substrate layer 108 of device 100), and then spot weld the sleeve in place. Although approach provides a mechanically robust joint, it is time consuming and the resultant microwave assembly has undesirable electrical reflections.

In accordance with one or more embodiments and/or fabrication techniques of the subject disclosure as described herein, a metal object such as, for instance, a metal connector (e.g., metal connector 204) comprising a microwave connector (e.g., a microwave coaxial connector, a SMA type connector, etc.) can be soldered directly to an electroplated metal film or metal layer (e.g., metal layer 116) formed on a NbTi coaxial cable (e.g., formed on the surfaces of substrate layer 108 at the distal end(s) of device 100) using a standard low temperature (e.g., less than 350 degrees Celsius (° C.)) soldering process. For example, the standard low temperature soldering process can involve the use of flux (e.g. rosin, acid, etc.) with heat (e.g., typically less than 350° C.), and a solder material (e.g. lead tin, silver tin, etc.). As a result, in accordance with one or more embodiments and/or fabrication techniques of the subject disclosure as described herein, such a metal connector described above can be efficiently and/or effectively soldered to such a metal plated end (e.g., metal layer 116) of a NbTi coaxial cable (e.g., device 100) without the use of and/or the corresponding drawbacks of a high vacuum soldering procedure, an ultrasonic soldering iron, and/or a solderable sleeve spot welding procedure.

FIG. 2A illustrates a top view of the example, non-limiting device 100 of FIGS. 1A and 1B after coupling one or more metal objects to the metal layer of device 100 in accordance with one or more embodiments described herein. FIG. 2B illustrates a cross-sectional side view of device 200 as viewed along a plane defined by line 202. Repetitive description of like elements and/or processes employed in other embodiments described herein is omitted for sake of brevity.

Device 200 can comprise an example, non-limiting alternative embodiment of device 100 after coupling one or more metal objects such as, for instance, one or more metal connectors 204 to one or more metal layers 116 that can be formed on device 100 as illustrated in FIG. 2A and the inset view of an end of device 200 depicted in FIG. 2B. In an embodiment, device 200 can comprise a coaxial cable assembly.

With reference to the example embodiment illustrated in FIGS. 2A and 2B, metal connectors 204 can be respectively bonded to and/or soldered (e.g., using a metal to metal soldering such as, for instance, a Cu to Au soldering technique) onto respective ends (e.g., distal ends) of device 100 via metal layers 116 that can be formed on such ends of device 100. In the example embodiment depicted in FIGS. 2A and 2B, metal connectors 204 can respectively cover a portion of the exposed surface of each metal layer 116 that can be plated on the surface of substrate layer 108 at each distal end of device 100 as described above. In some embodiments, metal connectors 204 can cover some or most of the exposed surface of each metal layer 116 such that the portion of the exposed surface of each metal layer 116 that remains exposed is adequate to enable soldering of metal connectors 204 to third metal layer 114 on each metal layer 116.

Metal connectors 204 can comprise a metal and/or a metal surface capable of being soldered directly onto third metal layer 114 of metal layer 116 using, for instance, a metal to metal soldering technique (e.g., a Cu to Au soldering technique). For example, in some embodiments, metal connectors 204 can comprise Cu and/or Ni. Other suitable materials that can be used for metal connectors 204 can include, but are not limited to: Au, aluminum (Al), brass, steel, and/or Fe.

The metal to metal soldering techniques that can be employed to solder one or more metal connectors 204 to metal layer 116 (e.g., to third metal layer 114) can use a solder material having a melting point that is lower than that of the respective metals used to form metal layer 116 (e.g., a melting point that is lower than that of the metal used to form first metal layer 110, second metal layer 112, and/or third metal layer 114). In this regard, as illustrated in the example embodiment illustrated in FIGS. 2A and 2B, device 200 can further comprise a solder material 206 formed between metal layer 116 (e.g., between third metal layer 114) and a metal surface of a metal object such as, for instance, metal connector 204 bonded and/or soldered thereto. In some embodiments, solder material 206 can comprise a solder material including, but not limited to, lead (Pb), tin (Sn), Ag, and/or another solder material. In some embodiments, solder material 206 can comprise a solder alloy including, but not limited to, alloys comprised of two or more of the following: indium (In), Sn, bismuth (Bi), Ag, zinc (Zn), Pb, gallium (Ga), and/or another solder alloy.

In various embodiments, one or more of metal connectors 204 can comprise a microwave coaxial cable connector. For example, in some embodiments, one or more of metal connectors 204 can comprise a SMA type connector. In these embodiments, device 200, which can comprise a coaxial cable assembly, can operate at ultra-low-temperatures (e.g., less than 1.0 Kelvin) while facilitating improved signal transmission (e.g., microwave signal transmission), reduced attenuation, constant impedance, and/or reduced or no undesirable signal reflections (e.g., undesirable microwave signal reflections). In numerous embodiments, the mechanical strength of device 200 at all temperatures is indistinguishable from an existing copper coaxial cable having one or more metal connectors 204 coupled thereto (e.g., soldered thereto). In some embodiments, device 200, which can comprise a coaxial cable assembly, can have a frequency range that extends up to approximately 10.0 gigahertz (GHz) to enable usage of device 200 in a qubit waveguide readout process (e.g., as described below with reference to FIG. 4).

FIG. 3 illustrates a block diagram of an example, non-limiting system 300 that can facilitate a qubit readout procedure using a NbTi cable assembly in accordance with one or more embodiments described herein. Repetitive description of like elements employ in respective embodiments is omitted for sake of brevity. Repetitive description of like elements and/or processes employed in other embodiments described herein is omitted for sake of brevity.

As illustrated in the example embodiment depicted in FIG. 3, system 300 can comprise a waveform generator 302 that can be coupled to a qubit 306 positioned in a dilution refrigerator 308 (e.g., a cryostat, a cryogenic refrigerator, etc.). In the example embodiment illustrated in FIG. 3, qubit 306 can be coupled to waveform generator 302 via a signal input line 304 that can facilitate transmission of signals (e.g., microwave signals) generated by waveform generator 302 to qubit 306. In this example embodiment, qubit 306 can be further coupled to an amplifier 312 via a signal readout line 310.

In some embodiments, signal readout line 310 can comprise a coaxial cable assembly such as, for instance, device 200 as depicted in FIG. 3. In these embodiments, signal readout line 310 (e.g., device 200) can comprise a NbTi coaxial cable assembly having metal connectors (e.g., metal connectors 204) that can be soldered to respective ends thereof (e.g., distal ends). In these embodiments, such metal connectors can be soldered to the respective ends of signal readout line 310 via a plated metal layer (e.g., metal layer 116) that can be formed on the surface of the respective ends of signal readout line 310 as described above with reference to FIGS. 1A, 1B, 2A, and 2B.

In various embodiments, a first end (e.g., a first distal end) of signal readout line 310 (e.g., device 200) can be coupled to qubit 306, either directly or via one or more intervening circuit elements (not illustrated in FIG. 3). In these embodiments, such a first end of signal readout line 310 can be coupled to qubit 306 via a first metal connector (e.g., metal connector 204) that can be soldered to the first end of signal readout line 310 as described above with reference to FIGS. 1A, 1B, 2A, and 2B.

In some embodiments, a second end (e.g., a second distal end) of signal readout line 310 (e.g., device 200) can be coupled to amplifier 312, either directly or via one or more intervening circuit elements (not illustrated in FIG. 3). In these embodiments, such a second end of signal readout line 310 can be coupled to qubit 306 via a second metal connector (e.g., metal connector 204) that can be soldered to the second end of signal readout line 310 as described above with reference to FIGS. 1A, 1B, 2A, and 2B.

In some embodiments, system 300 can comprise a qubit readout circuit. Existing technologies that can be employed to operate superconducting qubits such as, for instance, qubit 306 involve the use of cavity quantum electrodynamics (CQED), where microwave signals are applied (e.g., via waveform generator 302 and signal input line 304) to parts of a qubit readout circuit to probe the quantum state of a qubit (e.g., qubit 306). The microwave signals are then passed to an amplifier such as, for instance, amplifier 312 to facilitate the final determination of the qubit state. To facilitate performing qubit experiments at ultra-low temperatures, the qubit samples (e.g., qubit 306) are installed in a dilution refrigerator such as, for instance, dilution refrigerator 308. However, the operation of the dilution refrigerator imposes many trade-offs in the design of such qubit experiments. For example, one obstacle and/or challenge to perform such qubit experiments involves the ability to pass the microwave readout signals from the sample stage (e.g., from qubit 306 positioned in dilution refrigerator 308) to an intermediate cold amplifier (e.g., amplifier 312) at 4.0 Kelvin. Such an obstacle and/or challenge involves reducing attenuation and/or impedance mismatch on a coaxial signal readout line (e.g., signal readout line 310) that connects a qubit (e.g., qubit 306) to such an amplifier (e.g., amplifier 312). The ultra-low temperatures of the dilution refrigerator (e.g., dilution refrigerator 308) preclude the use of low electrical loss copper coax, and the use of common connections (e.g., high-resistance stainless and/or cupro-nickel coax) causes far too much attenuation for this application.

Usage of the subject NbTi coaxial cable assembly (e.g., device 200) described herein for the qubit signal readout line (e.g., signal readout line 310) provides an ideal solution to the above described problem. In particular, the thermal conductivity of the NbTi alloy of device 200 approaches zero when it becomes superconducting at around 11 Kelvin. The electronic contribution to the thermal conductivity goes to zero as a result of the Cooper electron pairing, and the phonon contribution to thermal conduction is spoiled by the introduction of titanium (Ti) into the niobium (Nb) metal which forms phonon scattering sites. In this regard, the subject NbTi coaxial cable assembly (e.g., device 200) provides excellent microwave properties, including low attenuation, constant impedance, and the absence of any undesirable signal reflections. For the specific application of qubit readout, the frequency range of the subject NbTi coaxial cable assembly (e.g., device 200) described herein can extend up to approximately 10.0 GHz.

Figure 4A:
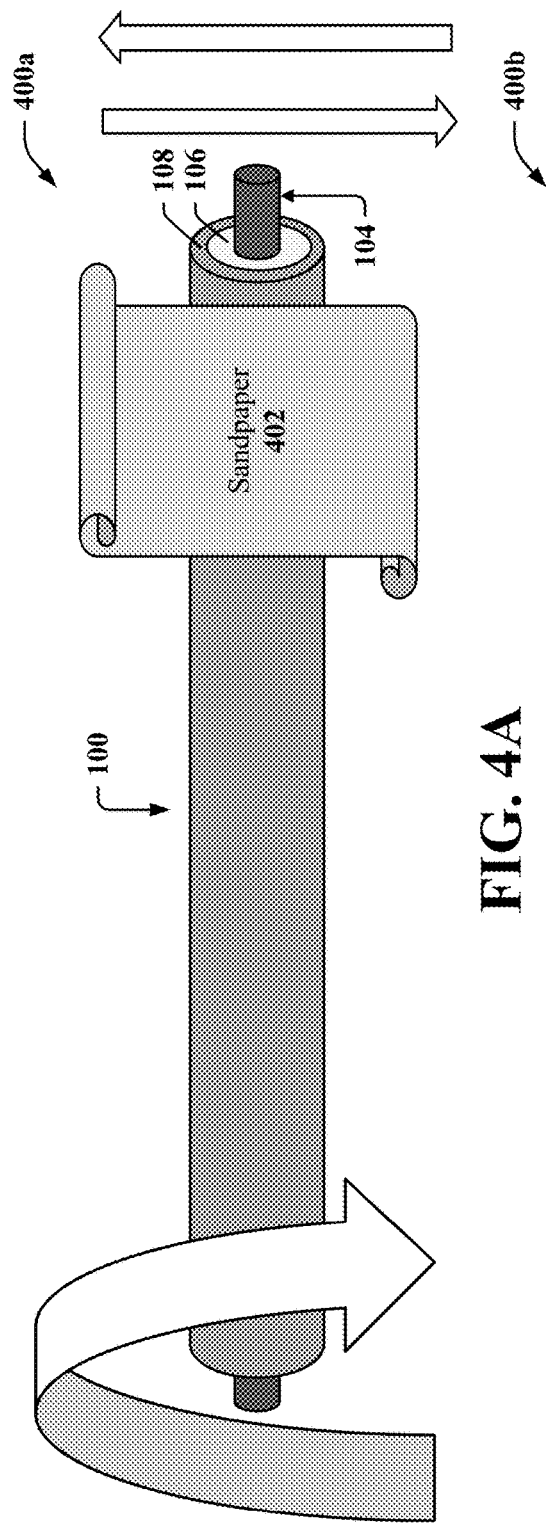
FIGS. 4A and 4B illustrate diagrams of example, non-limiting sanding procedures that can be employed to prepare a surface of one or more portions of the device of FIGS. 1A and 1B to facilitate adhesion of an electroplated metal layer thereto in accordance with one or more embodiments described herein.
Figure 4B:
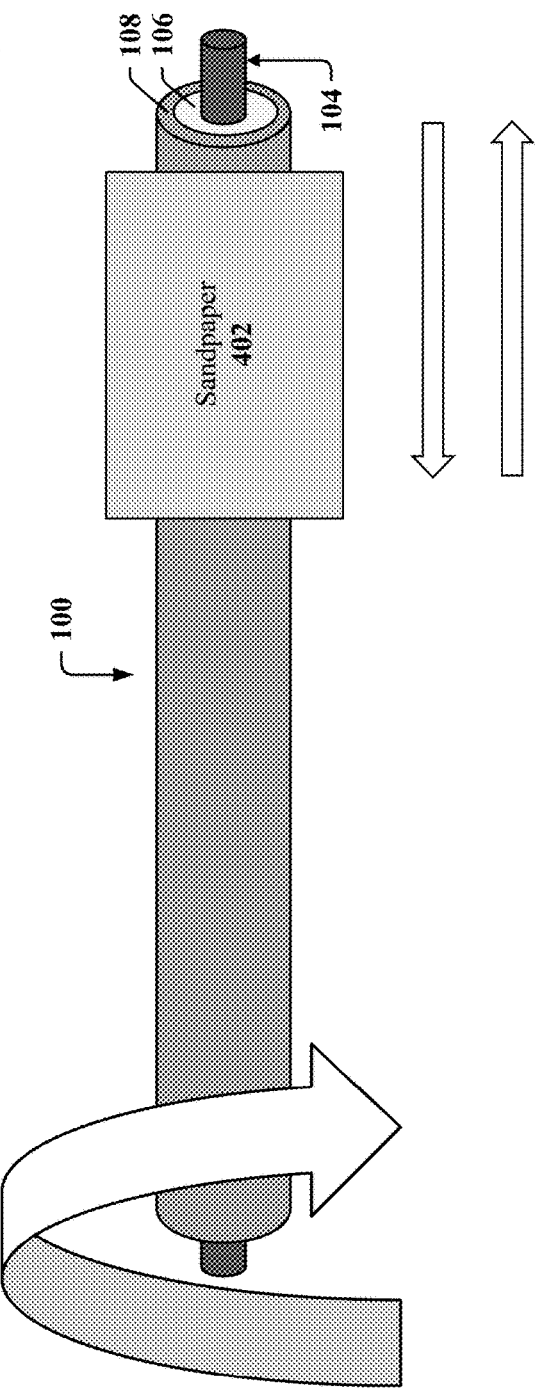

FIGS. 4A and 4B illustrate diagrams of example, non-limiting sanding procedures 400a and/or 400b that can be employed to prepare a surface of one or more portions of device 100 to facilitate adhesion of an electroplated metal layer thereto in accordance with one or more embodiments described herein. Repetitive description of like elements and/or processes employed in other embodiments described herein is omitted for sake of brevity.

In some embodiments, sanding procedures 400a and/or 400b can be employed to sand a surface of one or more portions of device 100 to facilitate adhesion of an electroplated metal layer thereto in accordance with one or more embodiments described herein. In one embodiment, sanding procedures 400a and/or 400b can correspond to step 2 of the example plating procedure described above with reference to FIGS. 1A and 1B.

As illustrated in FIG. 4A, sanding procedure 400a can comprise rotating sandpaper 402 in a direction perpendicular to an axis of device 100, where sandpaper 402 can comprise, for instance, sandpaper or emery paper having a grit value ranging from approximately 220 grit to approximately 320 grit. As illustrated in FIG. 4B, sanding procedure 400b can comprise rotating sandpaper 402 (e.g., 220-320 grit sandpaper or emery paper) in a direction parallel to an axis of device 100. In some embodiments, sanding procedure 400a can be performed prior to performing sanding procedure 400b. In some embodiments, sanding procedure 400a can be performed after performing sanding procedure 400b.

The various embodiments of the subject disclosure described herein (e.g., device 100, device 200, system 300, etc.) can be associated with various technologies. For example, the various embodiments of the subject disclosure described herein (e.g., device 100, device 200, system 300, etc.) can be associated with coaxial cable technologies, NbTi coaxial cable and/or wire technologies, NbTi coaxial cable and/or wire fabrication technologies, semiconductor and/or superconductor device technologies, semiconductor and/or superconductor device fabrication technologies, quantum computing device technologies, quantum computing device fabrication technologies, qubit readout circuit technologies, computer technologies, and/or other technologies.

The various embodiments of the subject disclosure described herein (e.g., device 100, device 200, system 300, etc.) can provide technical improvements to the various technologies listed above. For example, the various embodiments of the subject disclosure described herein (e.g., device 100, device 200, system 300, etc.) can each comprise a NbTi coaxial cable and/or wire having one or more metal layers (e.g., metal layer 116) to which one or more metal structures (e.g., metal connector 204) can be directly soldered to without the use of and/or the corresponding drawbacks of a high vacuum soldering procedure, an ultrasonic soldering iron, and/or a solderable sleeve spot welding procedure. In another example, the various embodiments of the subject disclosure described herein (e.g., device 100, device 200, system 300, etc.) can operate at ultra-low-temperatures (e.g., less than 1.0 Kelvin) while facilitating improved signal transmission (e.g., microwave signal transmission), reduced attenuation, constant impedance, and/or reduced or no undesirable signal reflections (e.g., undesirable microwave signal reflections). In another example, the various embodiments of the subject disclosure described herein (e.g., device 100, device 200, system 300, etc.) comprise mechanical strength at all temperatures that is indistinguishable from an existing terminated copper coaxial line. Accordingly, the various embodiments of the subject disclosure described herein (e.g., device 100, device 200, system 300, etc.) can comprise a NbTi coaxial cable and/or wire assembly that can serve as an improved waveguide for superconducting quantum bit (qubit) circuits (e.g., an improved waveguide used in a qubit readout circuit to perform readout operations of a qubit).

The various embodiments of the subject disclosure described herein (e.g., device 100, device 200, system 300, etc.) can provide technical improvements to a processing unit (e.g., a classical processor, a quantum processor, etc.) associated with one or more of the various embodiments of the subject disclosure described herein (e.g., device 100, device 200, system 300, etc.). For example, as described above, the various embodiments of the subject disclosure described herein (e.g., device 100, device 200, system 300, etc.) can operate at ultra-low-temperatures (e.g., less than 1.0 Kelvin) while facilitating improved signal transmission (e.g., microwave signal transmission), reduced attenuation, constant impedance, and/or reduced or no undesirable signal reflections (e.g., undesirable microwave signal reflections). In this example, as such embodiments of the subject disclosure described herein can be implemented in superconducting quantum bit (qubit) circuits (e.g., in a qubit readout circuit to perform readout operations of a qubit), such embodiments can facilitate improved performance and/or reduced computational costs of a processing unit (e.g., a classical processor, a quantum processor, etc.) used in such superconducting quantum bit (qubit) circuits. For instance, such embodiments can facilitate improved performance and/or reduced computational costs of such a processing unit by reducing the quantity of processing cycles the processing unit performs to achieve a certain goal (e.g., accurate readout of a quantum state of a qubit, a defined fidelity associated with qubit readout results, etc.), which can thereby reduce the computational costs of such a processing unit.

A practical application of the various embodiments of the subject disclosure described herein (e.g., device 100, device 200, system 300, etc.) is they can be implemented in a quantum computing system such as, for instance, a qubit readout circuit to improve transmission of microwave signals used to readout a quantum state of a qubit, which can facilitate fast and/or possibly universal quantum computing. Such a practical application can improve the output (e.g., computation and/or processing results) of one or more compilation jobs (e.g., quantum computing jobs) that are executed on a quantum computing device (e.g., quantum computer, quantum processor, etc.) that utilizes such a qubit readout circuit.

It should be appreciated that the various embodiments of the subject disclosure described herein (e.g., device 100, device 200, system 300, etc.) provide a new approach to facilitate coupling (e.g., soldering) a metal structure (e.g., metal connector 204) to a metal layer (e.g., metal layer 116) on a surface of a NbTi substrate which is driven by relatively new applications of microwave signal transmission devices (e.g., driven by relatively new applications of microwave signal transmission devices (e.g., waveguides) in quantum computing systems). For example, the various embodiments of the subject disclosure described herein (e.g., device 100, device 200, system 300, etc.) provide a new approach to facilitate coupling (e.g., soldering) a metal structure (e.g., metal connector 204) to a metal layer (e.g., metal layer 116) on a surface of a NbTi substrate to form a NbTi coaxial cable and/or wire assembly that can serve as an improved waveguide devices that can be used in various quantum computing systems (e.g., a qubit readout circuit).

The various embodiments of the subject disclosure described herein (e.g., device 100, device 200, system 300, etc.) can be coupled to hardware and/or software to solve problems that are highly technical in nature, that are not abstract and that cannot be performed as a set of mental acts by a human. For example, the various embodiments of the subject disclosure described herein (e.g., device 100, device 200, system 300, etc.) can be implemented in a quantum computing device that can process information and/or execute calculations that are not abstract and that cannot be performed as a set of mental acts by a human.

It should be appreciated that the various embodiments of the subject disclosure described herein (e.g., device 100, device 200, system 300, etc.) can utilize various combinations of electrical components, mechanical components, and circuitry that cannot be replicated in the mind of a human or performed by a human. For example, facilitating topological quantum computing is an operation that is greater than the capability of a human mind. For instance, the amount of data processed, the speed of processing such data, and/or the types of data processed over a certain period of time by such a quantum computing device utilizing the various embodiments of the subject disclosure described herein (e.g., device 100, device 200, system 300, etc.) can be greater, faster, and/or different than the amount, speed, and/or data type that can be processed by a human mind over the same period of time.

The various embodiments of the subject disclosure described herein (e.g., device 100, device 200, system 300, etc.) can also be fully operational towards performing one or more other functions (e.g., fully powered on, fully executed, etc.) while also performing the above-referenced operations. It should also be appreciated that such simultaneous multi-operational execution is beyond the capability of a human mind. It should also be appreciated that the various embodiments of the subject disclosure described herein (e.g., device 100, device 200, system 300, etc.) can include information that is impossible to obtain manually by an entity, such as a human user. For example, the type, amount, and/or variety of information included in and/or processed by the various embodiments of the subject disclosure described herein (e.g., device 100, device 200, system 300, etc.) can be more complex than information obtained manually by a human user.

Figure 5:
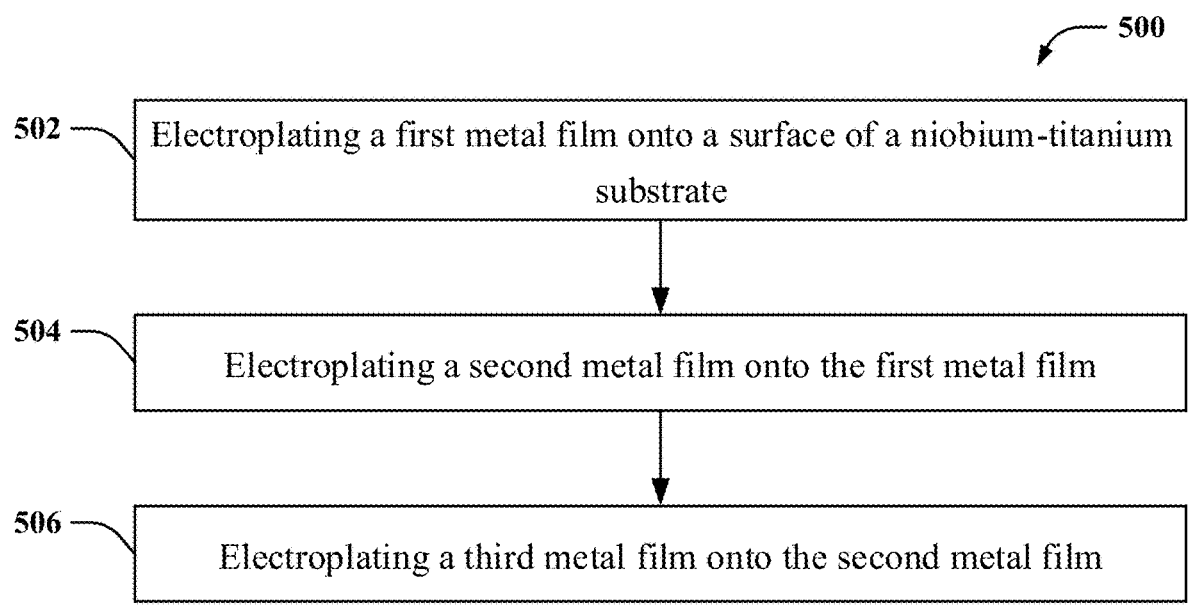
FIG. 5 illustrates a flow diagram of an example, non-limiting method that can facilitate plating one or more metal layers onto a niobium-titanium substrate in accordance with one or more embodiments described herein.

FIG. 5 illustrates a flow diagram of an example, non-limiting method 500 that can facilitate plating one or more metal layers onto a niobium-titanium substrate in accordance with one or more embodiments described herein. Repetitive description of like elements and/or processes employed in other embodiments described herein is omitted for sake of brevity.

At 502, method 500 can comprise electroplating (e.g., via an electroplating machine, computer 1012, etc.) a first metal film (e.g., first metal layer 110) onto a surface of a niobium-titanium substrate (e.g., substrate layer 108). In an embodiment, such a first film comprising first metal layer 110 can be electroplated onto a surface of such a niobium-titanium substrate comprising substrate layer 108 by implementing steps 1-12 and 19-24 in the example plating procedure described above with reference to FIGS. 1A and 1B.

At 504, method 500 can comprise electroplating (e.g., via an electroplating machine, computer 1012, etc.) a second metal film (e.g., second metal layer 112) onto the first metal film. In an embodiment, such a second metal film comprising second metal layer 112 can be electroplated onto a surface of such a first metal film comprising first metal layer 110 by implementing steps 1-15 and 19-24 in the example plating procedure described above with reference to FIGS. 1A and 1B.

At 506, method 500 can comprise electroplating (e.g., via an electroplating machine, computer 1012, etc.) a third metal film (e.g., third metal layer 114) onto the second metal film. In an embodiment, such a third metal film comprising third metal layer 114 can be electroplated onto a surface of such a second metal film comprising second metal layer 112 by implementing steps 1-24 in the example plating procedure described above with reference to FIGS. 1A and 1B.

Figure 6:
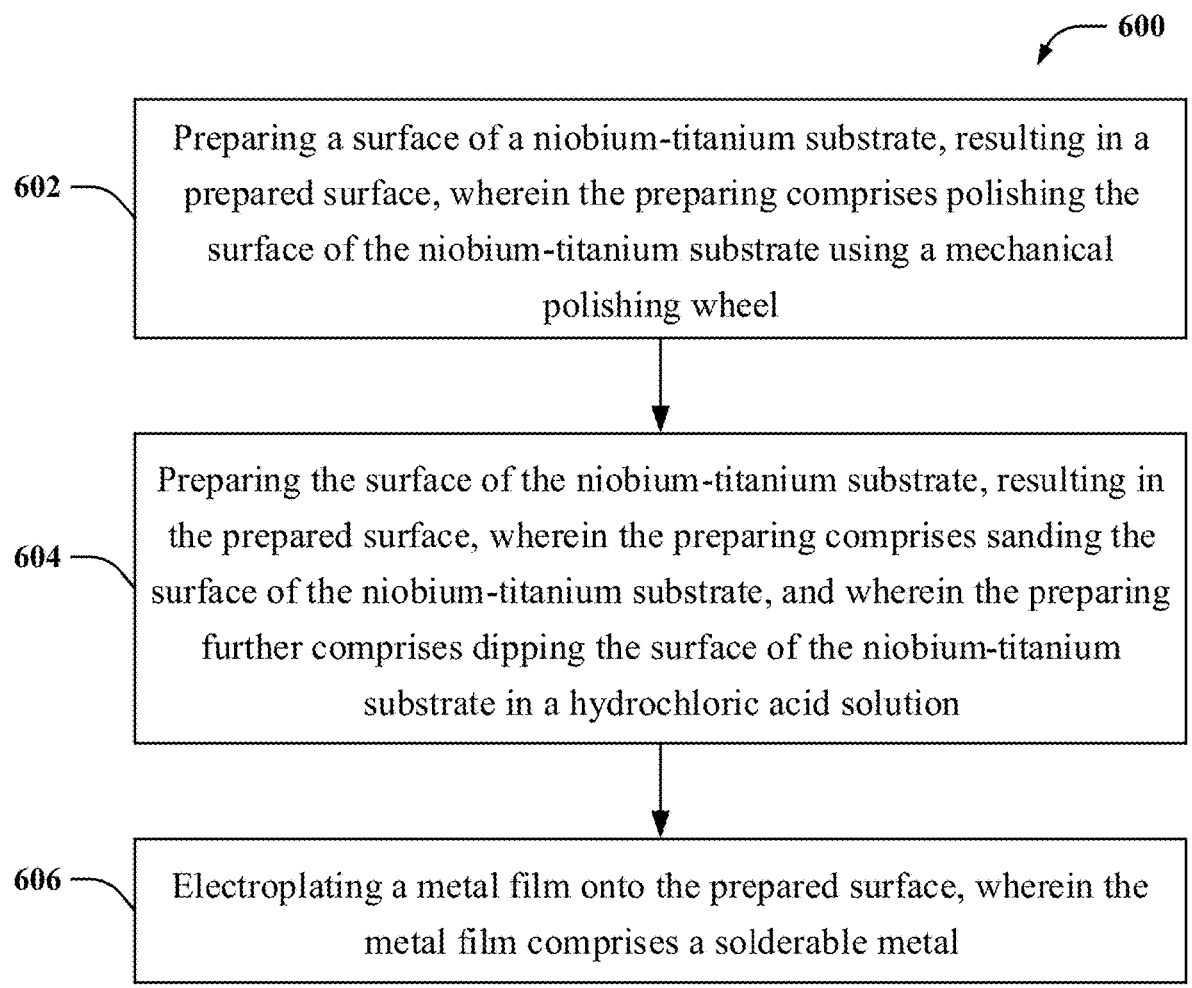
FIG. 6 illustrates a flow diagram of an example, non-limiting method that can facilitate plating one or more metal layers onto a niobium-titanium substrate in accordance with one or more embodiments described herein.

FIG. 6 illustrates a flow diagram of an example, non-limiting method 600 that can facilitate plating one or more metal layers onto a niobium-titanium substrate in accordance with one or more embodiments described herein. Repetitive description of like elements and/or processes employed in other embodiments described herein is omitted for sake of brevity.

At 602, method 600 can comprise preparing (e.g., via a metal polishing wheel, computer 1012, etc.) a surface of a niobium-titanium substrate (e.g., substrate layer 108), resulting in a prepared surface, wherein the preparing comprises polishing the surface of the niobium-titanium substrate using a mechanical polishing wheel. In an embodiment, such a prepared surface can be prepared on a surface of substrate layer 108 by implementing steps 1-9 in the example plating procedure described above with reference to FIGS. 1A and 1B, where step 1 corresponds to the polishing operation described here at 602 of method 600.

At 604, method 600 can comprise preparing (e.g., via sandpaper, a sanding machine, computer 1012, etc.) the surface of the niobium-titanium substrate, resulting in the prepared surface, wherein the preparing comprises sanding the surface of the niobium-titanium substrate (e.g., via emery paper, 220-320 grit sandpaper, etc.), and wherein the preparing further comprises dipping (e.g., soaking) the surface of the niobium-titanium substrate in a hydrochloric acid solution (e.g., a 50% hydrochloric acid solution). In an embodiment, such a prepared surface can be prepared on a surface of substrate layer 108 by implementing steps 1-9 in the example plating procedure described above with reference to FIGS. 1A and 1B, where steps 1 and 8 respectively correspond to the sanding operation and the dipping operation described here at 604 of method 600.

At 606, method 600 can comprise electroplating (e.g., via an electroplating machine, computer 1012, etc.) a metal film (e.g., metal layer 116) onto the prepared surface, wherein the metal film comprises a solderable metal (e.g., first metal layer 110, second metal layer 112, and/or third metal layer 114). In an embodiment, such a metal film can comprise metal layer 116, which can comprise first metal layer 110, second metal layer 112, and/or third metal layer 114. In this embodiment, first metal layer 110, second metal layer 112, and/or third metal layer 114 can comprise such a solderable metal that can be soldered. In this embodiment, such a metal film (e.g., metal layer 116) that can comprise first metal layer 110, second metal layer 112, and/or third metal layer 114 can be electroplated onto such a prepared surface of substrate layer 108 by implementing steps 10-18 in the example plating procedure described above with reference to FIGS. 1A and 1B.

Figure 7:
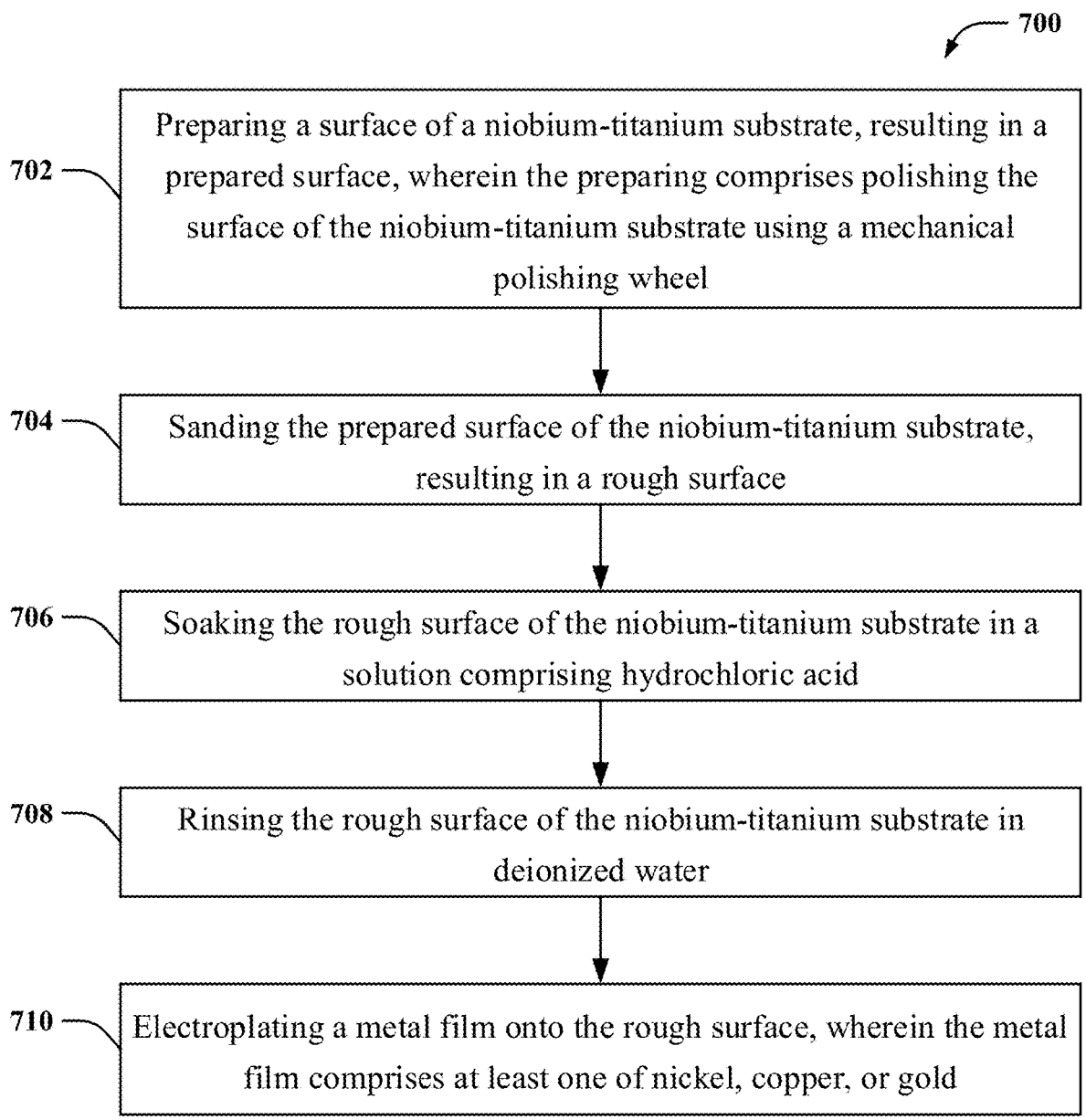
FIG. 7 illustrates a flow diagram of an example, non-limiting method that can facilitate plating one or more metal layers onto a niobium-titanium substrate in accordance with one or more embodiments described herein.

FIG. 7 illustrates a flow diagram of an example, non-limiting method 700 that can facilitate plating one or more metal layers onto a niobium-titanium substrate in accordance with one or more embodiments described herein. Repetitive description of like elements and/or processes employed in other embodiments described herein is omitted for sake of brevity.

At 702, method 700 can comprise preparing (e.g., via a metal polishing wheel, computer 1012, etc.) a surface of a niobium-titanium substrate (e.g., substrate layer 108), resulting in a prepared surface, wherein the preparing comprises polishing the surface of the niobium-titanium substrate using a mechanical polishing wheel. In an embodiment, such a prepared surface can be prepared on a surface of substrate layer 108 by implementing steps 1-9 in the example plating procedure described above with reference to FIGS. 1A and 1B, where step 1 corresponds to the polishing operation described here at 702 of method 700.

At 704, method 700 can comprise sanding (e.g., via sandpaper, a sanding machine, computer 1012, etc.) the prepared surface of the niobium-titanium substrate, resulting in a rough surface (e.g., an abrasive surface). In an embodiment, such a prepared surface and/or rough surface can be prepared on a surface of substrate layer 108 by implementing steps 1-9 in the example plating procedure described above with reference to FIGS. 1A and 1B, where step 2 corresponds to the sanding operation described here at 704 of method 700.

At 706, method 700 can comprise soaking (e.g., via soaking equipment, hydrochloric acid solution, computer 1012, etc.) the rough surface of the niobium-titanium substrate in a solution comprising hydrochloric acid (e.g., a 50% hydrochloric acid solution). In an embodiment, such a prepared surface and/or rough surface can be prepared on a surface of substrate layer 108 by implementing steps 1-9 in the example plating procedure described above with reference to FIGS. 1A and 1B, where step 8 corresponds to the soaking operation described here at 706 of method 700.

At 708, method 700 can comprise rinsing (e.g., via rinsing equipment, deionized water, computer 1012, etc.) the rough surface of the niobium-titanium substrate in deionized water. In an embodiment, such a prepared surface and/or rough surface can be prepared on a surface of substrate layer 108 by implementing steps 1-9 in the example plating procedure described above with reference to FIGS. 1A and 1B, where step 9 corresponds to the rinsing operation described here at 708 of method 700.

At 710, method 700 can comprise electroplating (e.g., via an electroplating machine, computer 1012, etc.) a metal film (e.g., metal layer 116) onto the rough surface, wherein the metal film comprises at least one of Ni, Cu, or Au (e.g., first metal layer 110, second metal layer 112, and/or third metal layer 114, respectively). In an embodiment, such a metal film can comprise metal layer 116, which can comprise first metal layer 110, second metal layer 112, and/or third metal layer 114. In this embodiment, first metal layer 110 can comprise Ni, second metal layer 112 can comprise Cu, and/or third metal layer 114 can comprise Au. In this embodiment, such a metal film (e.g., metal layer 116) that can comprise first metal layer 110 comprising Ni, second metal layer 112 comprising Cu, and/or third metal layer 114 comprising Au can be electroplated onto such a rough surface of substrate layer 108 by implementing steps 10-18 in the example plating procedure described above with reference to FIGS. 1A and 1B.

Figure 8:
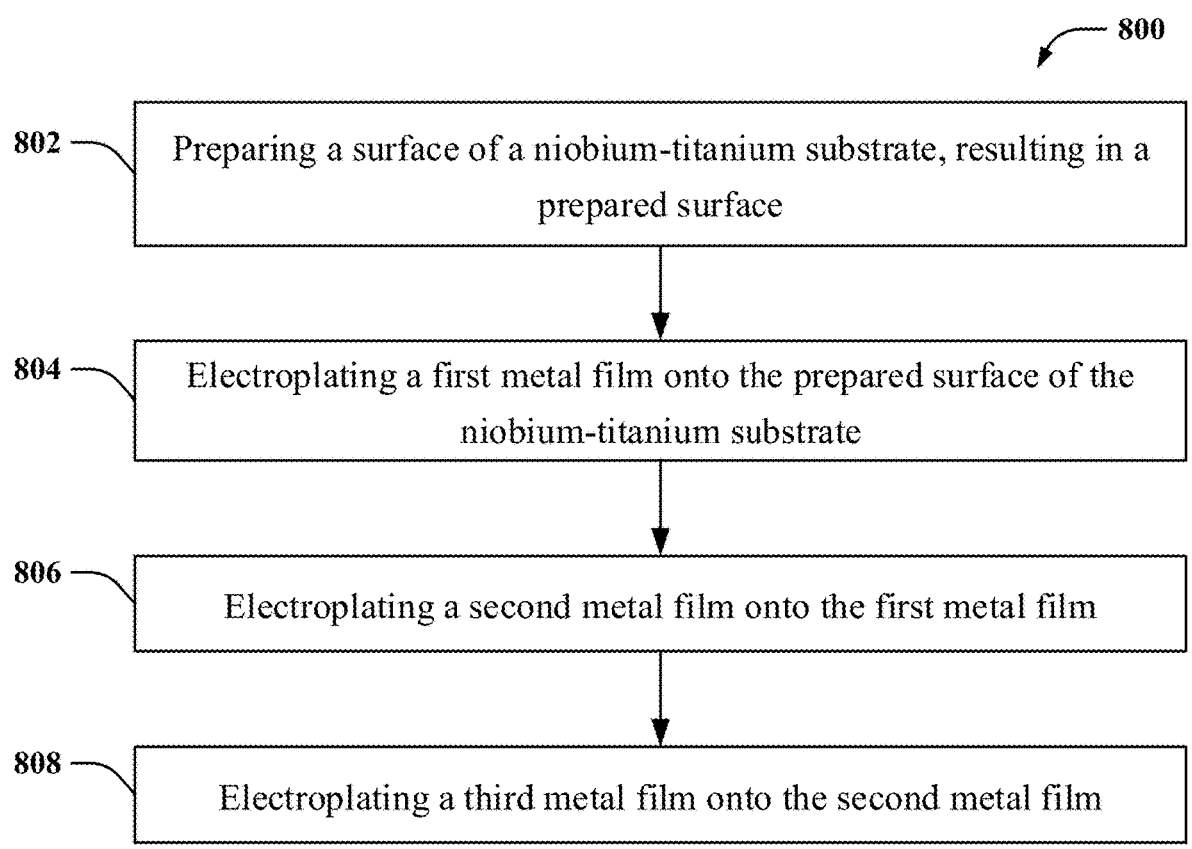
FIG. 8 illustrates a flow diagram of an example, non-limiting method that can facilitate plating one or more metal layers onto a niobium-titanium substrate in accordance with one or more embodiments described herein.

FIG. 8 illustrates a flow diagram of an example, non-limiting method 800 that can facilitate plating one or more metal layers onto a niobium-titanium substrate in accordance with one or more embodiments described herein. Repetitive description of like elements and/or processes employed in other embodiments described herein is omitted for sake of brevity.

At 802, method 800 can comprise preparing (e.g., via a metal polishing wheel, sandpaper, a sanding machine, soaking equipment, HCL acid solution, rinsing equipment, DI water, computer 1012, etc.) a surface of a niobium-titanium substrate (e.g., substrate layer 108), resulting in a prepared surface. In an embodiment, such a prepared surface can be prepared on a surface of substrate layer 108 by implementing steps 1-9 in the example plating procedure described above with reference to FIGS. 1A and 1B.

At 804, method 800 can comprise electroplating (e.g., via an electroplating machine, computer 1012, etc.) a first metal film (e.g., first metal layer 110) onto the prepared surface of the niobium-titanium substrate. In an embodiment, such a first metal film comprising first metal layer 110 can be electroplated onto such a prepared surface of such a niobium-titanium substrate comprising substrate layer 108 by implementing steps 1-12 and 19-24 in the example plating procedure described above with reference to FIGS. 1A and 1B.

At 806, method 800 can comprise electroplating (e.g., via an electroplating machine, computer 1012, etc.) a second metal film (e.g., second metal layer 112) onto the first metal film. In an embodiment, such a second metal film comprising second metal layer 112 can be electroplated onto a surface of such a first metal film comprising first metal layer 110 by implementing steps 1-15 and 19-24 in the example plating procedure described above with reference to FIGS. 1A and 1B.

At 808, method 800 can comprise electroplating (e.g., via an electroplating machine, computer 1012, etc.) electroplating a third metal film (e.g., third metal layer 114) onto the second metal film. In an embodiment, such a third metal film comprising third metal layer 114 can be electroplated onto a surface of such a second metal film comprising second metal layer 112 by implementing steps 1-24 in the example plating procedure described above with reference to FIGS. 1A and 1B.

Figure 9:
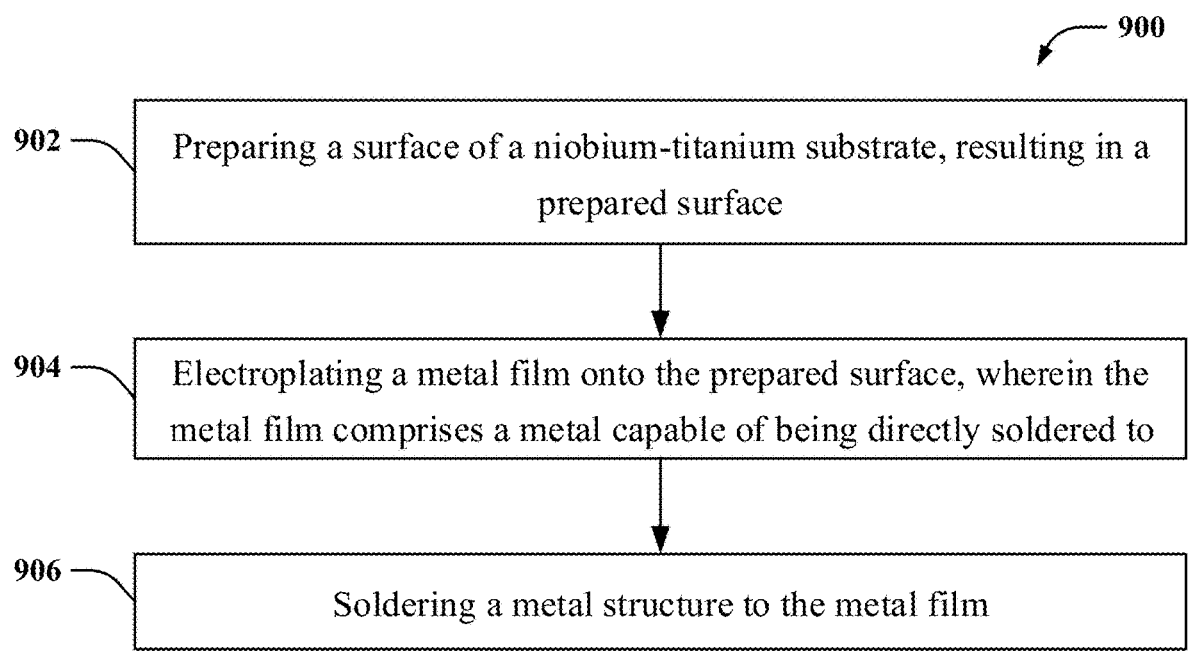
FIG. 9 illustrates a flow diagram of an example, non-limiting method that can facilitate plating one or more metal layers onto a niobium-titanium substrate in accordance with one or more embodiments described herein.

FIG. 9 illustrates a flow diagram of an example, non-limiting method 900 that can facilitate plating one or more metal layers onto a niobium-titanium substrate in accordance with one or more embodiments described herein. Repetitive description of like elements and/or processes employed in other embodiments described herein is omitted for sake of brevity.

At 902, method 900 can comprise preparing (e.g., via a metal polishing wheel, sandpaper, a sanding machine, soaking equipment, HCL acid solution, rinsing equipment, DI water, computer 1012, etc.) a surface of a niobium-titanium substrate (e.g., substrate layer 108), resulting in a prepared surface. In an embodiment, such a prepared surface can be prepared on a surface of substrate layer 108 by implementing steps 1-9 in the example plating procedure described above with reference to FIGS. 1A and 1B.

At 904, method 900 can comprise electroplating (e.g., via an electroplating machine, computer 1012, etc.) a metal film (e.g., metal layer 116) onto the prepared surface, wherein the metal film comprises a metal capable of being directly soldered to (e.g., first metal layer 110, second metal layer 112, and/or third metal layer 114). In an embodiment, such a metal film can comprise metal layer 116, which can comprise first metal layer 110, second metal layer 112, and/or third metal layer 114. In this embodiment, first metal layer 110, second metal layer 112, and/or third metal layer 114 can comprise such a metal that can be directly soldered to. In this embodiment, such a metal film (e.g., metal layer 116) that can comprise first metal layer 110, second metal layer 112, and/or third metal layer 114 can be electroplated onto such a prepared surface of substrate layer 108 by implementing steps 10-18 in the example plating procedure described above with reference to FIGS. 1A and 1B.

At 906, method 900 can comprise soldering (e.g., via soldering equipment, soldering device, soldering iron, soldering flux, computer 1012, etc.) a metal structure (e.g., metal connector 204) to the metal film. In an embodiment, one or more metal connectors 204 can be soldered to one or more prepared surfaces on substrate layer 108 of device 100 using one or more metal to metal soldering techniques (e.g., a Cu to Au soldering technique) as described above with reference to FIGS. 1A, 1B, 2A, and 2B.

Figure 10:
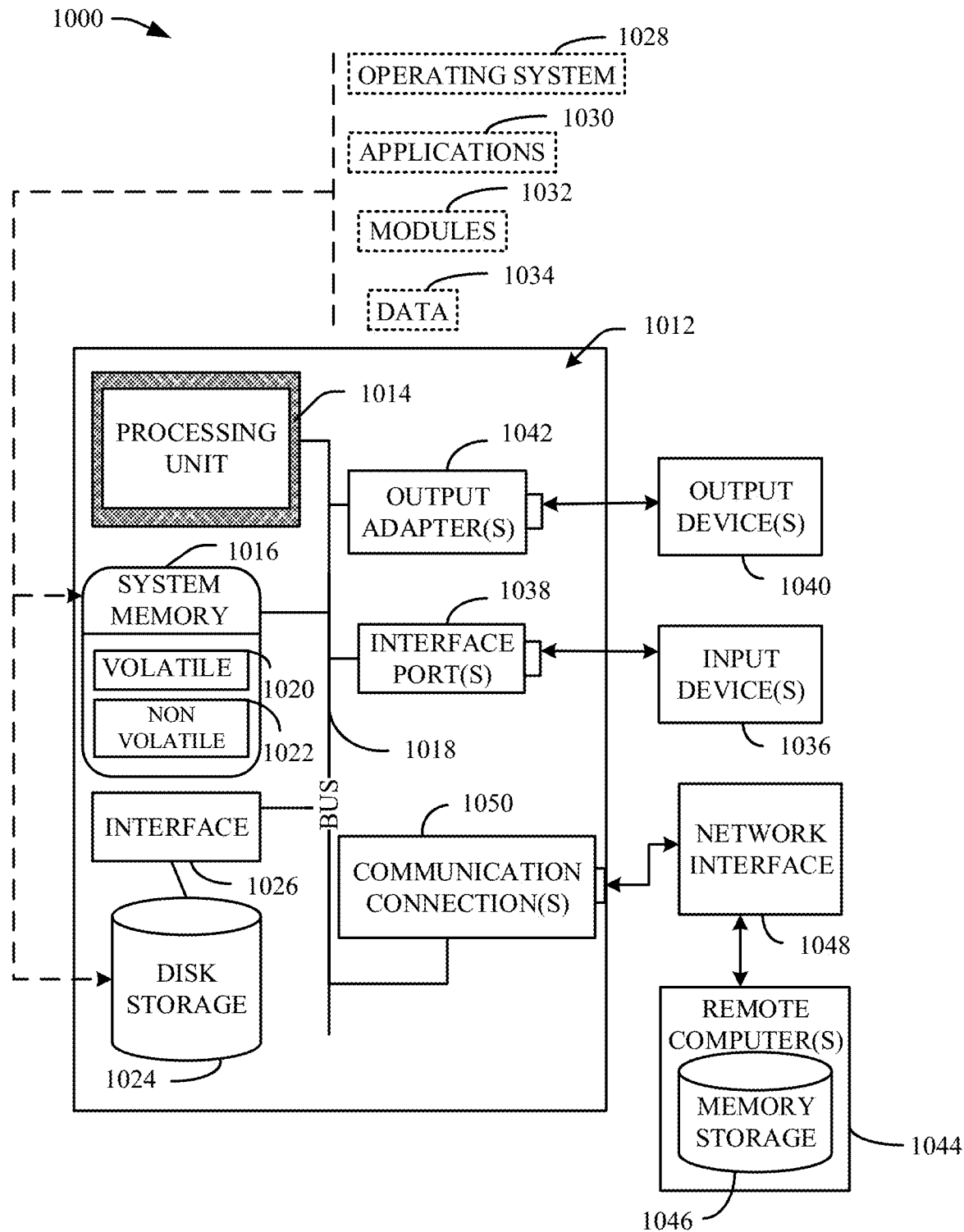
FIG. 10 illustrates a block diagram of an example, non-limiting operating environment in which one or more embodiments described herein can be facilitated.

The example, non-limiting multi-step fabrication sequences described above with reference to FIGS. 1A-2B (e.g., steps 1-24 of the example plating procedure) and/or the operations of method 500, 600, 700, 800, and/or 900 described above with reference to FIGS. 5-9, which can be implemented to fabricate one or more embodiments of the subject disclosure described herein and/or illustrated in the figures, can be implemented by a computing system (e.g., operating environment 1000 illustrated in FIG. 10 and described below) and/or a computing device (e.g., computer 1012 illustrated in FIG. 10 and described below). In non-limiting example embodiments, such computing system (e.g., operating environment 1000) and/or such computing device (e.g., computer 1012) can comprise one or more processors and one or more memory devices that can store executable instructions thereon that, when executed by the one or more processors, can facilitate performance of the example, non-limiting multi-step fabrication operations described herein with reference to FIGS. 1A-2B (e.g., steps 1-24 of the example plating procedure) and/or the operations of method 500, 600, 700, 800, and/or 900 described above with reference to FIGS. 5-9. As a non-limiting example, the one or more processors can facilitate performance of the example, non-limiting multi-step fabrication operations described herein with reference to FIGS. 1A-2B (e.g., steps 1-24 of the example plating procedure) and/or the operations of method 500, 600, 700, 800, and/or 900 described above with reference to FIGS. 5-9 by directing and/or controlling one or more systems and/or equipment operable to perform fabrication of a NbTi coaxial cable assembly and/or device in accordance with one or more embodiments described herein.

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. For example, operating environment 1000 can be used to implement the example, non-limiting multi-step fabrication operations described herein with reference to FIGS. 1A-2B (e.g., steps 1-24 of the example plating procedure) and/or the operations of method 500, 600, 700, 800, and/or 900 described above with reference to FIGS. 5-9, which can facilitate implementation of one or more embodiments of the subject disclosure described herein. Repetitive description of like elements and/or processes employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couple's system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM).

Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
electroplating a first metal film onto a surface of a niobium-titanium substrate;
electroplating a second metal film onto the first metal film; and
electroplating a third metal film onto the second metal film, wherein the niobium-titanium substrate comprises a niobium-titanium wire, and wherein the first metal film is comprised of nickel, the second metal film is comprised of copper and the third metal film is comprised of gold.

2. The method of claim 1, further comprising:
preparing the surface of the niobium-titanium substrate, resulting in a prepared surface, wherein the preparing comprises polishing the surface of the niobium-titanium substrate using a mechanical polishing wheel.

3. The method of claim 1, further comprising:
preparing the surface of the niobium-titanium substrate, resulting in a prepared surface, wherein the preparing comprises sanding the surface of the niobium-titanium substrate, and wherein the preparing further comprises dipping the surface of the niobium-titanium substrate in a hydrochloric acid solution.

4. The method of claim 1, further comprising:
soldering a metal surface to at least one of the first metal film, the second metal film, or the third metal film.

* * * * *